United States Patent
Chen et al.

(10) Patent No.: US 9,178,478 B2
(45) Date of Patent: Nov. 3, 2015

(54) METHOD AND APPARATUS FOR PROVIDING PRIVACY FOR TELEPHONE CONVERSATIONS

(75) Inventors: Bing Chen, Red Bank, NJ (US); John D. Francis, Brooklyn, NY (US); Laurie Garrison, Oceanport, NJ (US); Diane Nawrocki, Tinton Falls, NJ (US); David Nemec, Tinton Falls, NJ (US)

(73) Assignee: AT&T Intellectual Property II, L.P., Atlanta, GA (US)

( * ) Notice: Subject to any disclaimer, the term of this patent is extended or adjusted under 35 U.S.C. 154(b) by 2148 days.

(21) Appl. No.: 11/737,482

(22) Filed: Apr. 19, 2007

(65) Prior Publication Data

US 2008/0260168 A1 Oct. 23, 2008

(51) Int. Cl.
*H04M 9/00* (2006.01)
*H03G 3/02* (2006.01)

(52) U.S. Cl.
CPC ..................................... *H03G 3/02* (2013.01)

(58) Field of Classification Search
CPC ... H04M 1/6008; H04M 9/08; H04M 1/6033; H04M 1/80; H04M 1/60; H04M 9/082; H04B 3/03; H04B 3/20; H04B 3/23; H03G 3/32

USPC .............. 381/28, 57, 120, 28.57; 379/388.03, 379/390.01, 390.03, 392.01, 379/406.01–406.16; 455/127.3, 114.3, 144, 455/194.2, 253.2, 341

See application file for complete search history.

(56) References Cited

U.S. PATENT DOCUMENTS

| | | | | |
|---|---|---|---|---|
| 5,751,822 | A * | 5/1998 | Yamaguchi et al. | 381/94.1 |
| 5,852,769 | A * | 12/1998 | Ahmed et al. | 455/116 |
| 5,918,185 | A * | 6/1999 | Knoedl, Jr. | 455/570 |
| 6,212,275 | B1 * | 4/2001 | Akhteruzzaman | 379/421 |
| 7,469,051 | B2 * | 12/2008 | Sapashe et al. | 381/104 |
| 2002/0099538 | A1 * | 7/2002 | Saito | 704/205 |
| 2005/0096904 | A1 * | 5/2005 | Taniguchi et al. | 704/226 |
| 2005/0245290 | A1 * | 11/2005 | Lucey et al. | 455/570 |
| 2007/0253569 | A1 * | 11/2007 | Bose | 381/71.6 |
| 2007/0253578 | A1 * | 11/2007 | Verdecanna et al. | 381/104 |

* cited by examiner

*Primary Examiner* — Akelaw Teshale

(57) ABSTRACT

A method and apparatus for providing privacy for telephone conversations over communication networks is disclosed. For example, a telephony endpoint device comprises a microphone for receiving an audio signal and a gain boost circuit, coupled to the microphone, for applying a gain boost to the audio signal. The telephony endpoint device also comprises a switch, coupled to the gain boost circuit, wherein operating the switch will control whether the gain boost is to be applied to the audio signal.

17 Claims, 4 Drawing Sheets

METHOD AND APPARATUS FOR PROVIDING PRIVACY FOR TELEPHONE CONVERSATIONS

The present invention relates generally to communication networks and, more particularly, to a method for providing privacy for telephone conversations over communication networks.

BACKGROUND OF THE INVENTION

As more and more customers are demanding mobility, mobile end-devices and wireless services have become ubiquitous. For example, businesses and consumers often opt to obtain a cellular phone service instead of the traditional telephone service in order to increase mobility. Wireless endpoint devices are being used to access services such as Voice over Internet Protocol (VoIP) from any location via a wireless access network. Hence, more and more phone conversations are occurring in public areas. For example, a cellular (cell) phone may be used while traveling on a train, bus, etc. There is often a need for a cell phone user to speak in low volume for privacy reasons. For example, the cell phone user may need to speak in low volume when sensitive or private matters are being discussed. However, speaking in a low volume degrades the quality of the transmitted speech signal. For example, the Coder/Decoder (CODEC) in the endpoint device (cell phone) may encounter difficulty encoding the low volume speech signal. As a result, the listener on the other end of the call may have difficulty hearing and/or understanding the low volume speech. The traditional method for handling this problem is to have the speaker physically move to another location to gain privacy. However, moving to a private location is not always possible. For example, the cell phone user may be on a bus, train, etc.

Therefore, there is a need for a method and apparatus that provides privacy for telephone conversations over communication networks.

SUMMARY OF THE INVENTION

In one embodiment, the present invention discloses a method and apparatus for providing privacy for telephone conversations over communication networks. For example, a telephony endpoint device comprises a microphone for receiving an audio signal and a gain boost circuit, coupled to the microphone, for applying a gain boost to the audio signal. The telephony endpoint device also comprises a switch, coupled to the gain boost circuit, wherein operating the switch will control whether the gain boost is to be applied to the audio signal.

BRIEF DESCRIPTION OF THE DRAWINGS

The teaching of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention broadly discloses a method and apparatus for performing traffic engineering on wireless access networks used for services such as VoIP and SoIP services. Although the present invention is discussed below in the context of packets for VoIP and SoIP services, the present invention is not so limited. Namely, the present invention can be applied for any service with mobile customers. Similarly, the present invention can be implemented on other networks such as the cellular network, the time division multiplexed network, etc.

Figure 1:
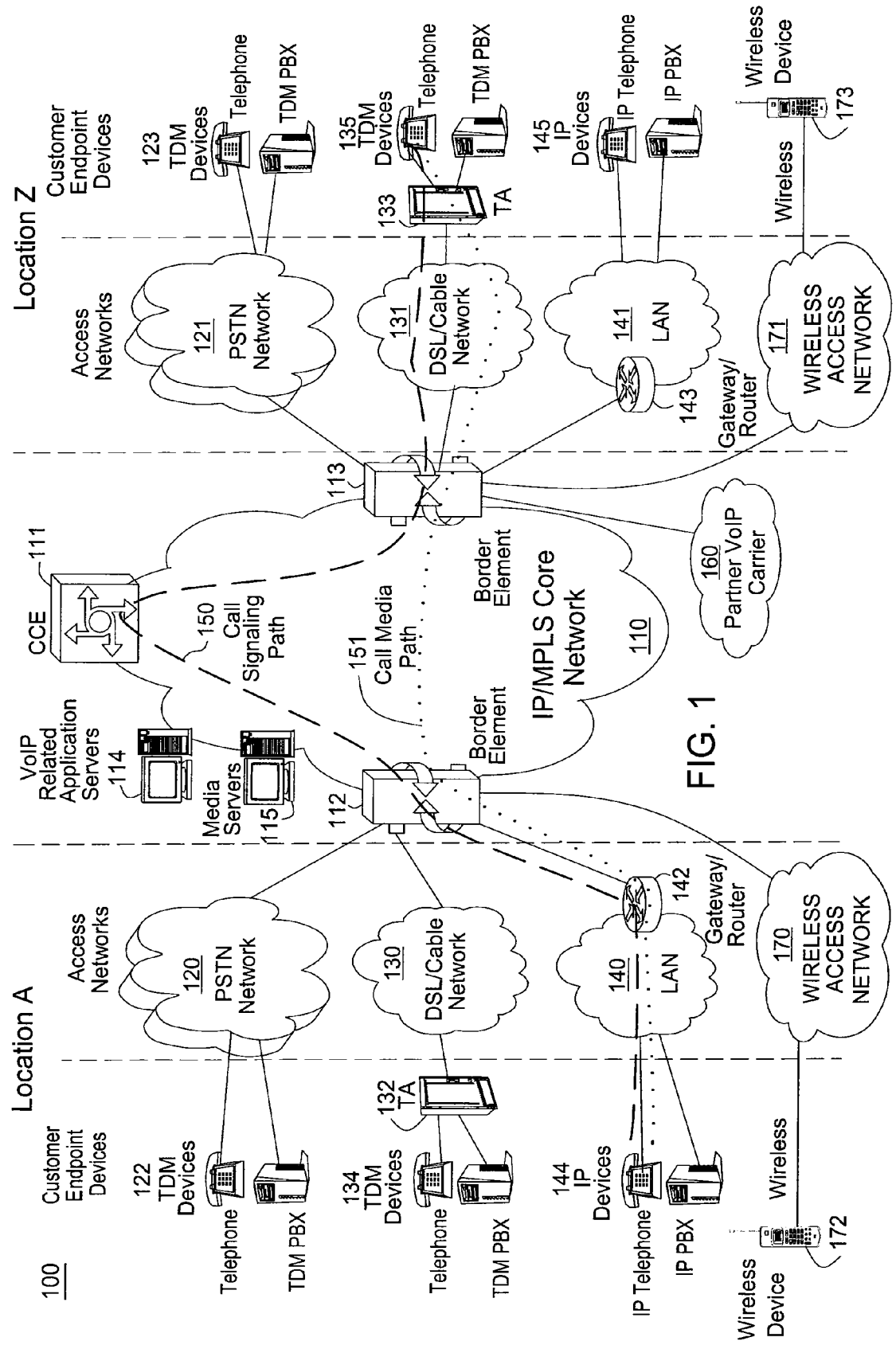
FIG. 1 illustrates an exemplary network related to the present invention.

To better understand the present invention, FIG. 1 illustrates an example network 100, e.g., a packet network such as a VoIP network related to the present invention. Exemplary packet networks include Internet protocol (IP) networks, Asynchronous Transfer Mode (ATM) networks, frame-relay networks, and the like. An IP network is broadly defined as a network that uses Internet Protocol to exchange data packets. Thus, a VoIP network or a SoIP (Service over Internet Protocol) network is considered an IP network.

In one embodiment, the VoIP network may comprise various types of customer endpoint devices connected via various types of access networks to a carrier (a service provider) VoIP core infrastructure over an Internet Protocol/Multi-Protocol Label Switching (IP/MPLS) based core backbone network. Broadly defined, a VoIP network is a network that is capable of carrying voice signals as packetized data over an IP network. Although the present invention is described below in the context of an illustrative VoIP network, the present invention should not be interpreted as limited by this particular illustrative architecture.

In one embodiment, the customer endpoint devices can be either Time Division Multiplexing (TDM) based, IP based or wireless such as cellular phones. TDM based customer endpoint devices 122, 123, 134, and 135 may comprise TDM phones or Private Branch Exchange (PBX). IP based customer endpoint devices 144 and 145 may comprise IP phones or IP PBX. Wireless endpoint devices 172 and 173, may comprise cellular phones, pocket PCs, etc. The Terminal Adaptors (TA) 132 and 133 can be used to provide necessary interworking functions between TDM customer endpoint devices, such as analog phones, and packet based access network technologies, such as Digital Subscriber Loop (DSL) or Cable broadband access networks. TDM based customer endpoint devices may access VoIP services by using either a Public Switched Telephone Network (PSTN) 120, 121 or a broadband access network 130, 131 via the TA 132 or 133. IP based customer endpoint devices may access VoIP services by using a Local Area Network (LAN) 140 and 141 which has a VoIP gateway router 142 or 143, as shown in FIG. 1. Wireless endpoint devices may access VoIP services by using wireless access networks 170 and 171. The wireless access networks 170 and 171 can be connected to the IP core network 110 through the border elements 112 and 113, respectively.

The access networks for wired devices can be either TDM or packet based. For example, a TDM PSTN 120 or 121 can be used to support TDM customer endpoint devices connected via traditional phone lines. A packet based access network, such as Frame Relay, ATM, Ethernet or IP, can be used to support IP based customer endpoint devices via a customer LAN, e.g., 140 with a VoIP gateway and router 142.

A packet based access network 130 or 131, such as DSL or Cable, when used together with a TA 132 or 133, can be used to support TDM based customer endpoint devices. The access networks for wireless devices 170 and 171 can be Worldwide Interoperability for Microwave Access (WiMax), Wireless Local Area Networks (WLAN) or Wireless Wide Area Networks (WWAN).

The core network infrastructure comprises of several components, such as the Border Elements (BEs) 112 and 113, the Call Control Element (CCE) 111, VoIP related Application Servers (AS) 114, and Media Server (MS) 115. The BE resides at the edge of the VoIP core infrastructure and interfaces with customers endpoints over various types of access networks. A BE can be implemented as a Media Gateway and performs signaling, media control, security, and call admission control and related functions. The CCE resides within the VoIP infrastructure and can communicate with the BEs using the Session Initiation Protocol (SIP) over the underlying IP/MPLS based core backbone network 110. The CCE can be implemented as a Media Gateway Controller or a softswitch and performs network wide call control related functions as well as interacts with the appropriate VoIP service related servers when necessary. The CCE functions as a SIP back-to-back user agent and is a signaling endpoint for all call legs between all BEs and the CCE. The CCE may need to interact with various VoIP related Application Servers (AS) in order to complete a call that requires certain service specific features, e.g., translation of an E.164 voice network address into an IP address and so on. Media Servers (MS) 115 are special servers that may handle and terminate media streams, to provide services such as announcements, bridges, transcoding, and Interactive Voice Response (IVR) messages for VoIP service applications. The media servers may also interact with customers for media session management to accomplish tasks such as processing customer requests.

For calls that originate or terminate in a different carrier, they can be handled through the PSTN 120 and 121 or the Partner IP Carrier 160 interconnections. For originating or terminating TDM calls, they can be handled via existing PSTN interconnections to the other carrier. For originating or terminating VoIP calls, they can be handled via the Partner IP carrier interface 160 to the other carrier.

Note that a customer in location A using any endpoint device type with its associated access network type can communicate with another customer in location Z using any endpoint device type with its associated network type as well. For instance, a customer at location A using a wireless endpoint device 172 with wireless access network 170 can call another customer at location Z using a TDM endpoint device 123 with PSTN access network 121. The BEs 112 and 113 are responsible for the necessary signaling protocol translation, e.g., SS7 to and from SIP, and media format conversion, such as TDM voice format to and from IP based packet voice format.

The above network is only described to provide an illustrative environment in which voice and data services are provided on communications networks. Customers are increasingly accessing network services in a mobile manner. For example, a VoIP service customer can access subscribed service via a mobile IP device from anywhere. In another example, a customer may subscribe to a cellular telephone service, thereby allowing the customer to use his/her cell phone for voice services in a mobile manner. As more and more customers are demanding mobility, mobile endpoint devices and wireless services have become ubiquitous. Hence, more and more phone conversations are occurring in public areas. For example, a cellular (cell) phone may be used while traveling on a train, bus, etc. There is often a need for a cell phone user to speak in a low volume for privacy reasons. For example, the cell phone user may need to speak in a low volume when sensitive or private matters are being discussed. However, speaking in a low volume degrades the quality of the transmitted speech signal. For example, the CODEC in the cell phone may encounter difficulty encoding the low volume speech signal. As a result, the listener on the other end of the call may have difficulty hearing and/or understanding the low volume speech signal. Therefore, there is a need for a method and apparatus that provides privacy for telephone conversations over communication networks.

In one embodiment, the current invention discloses a method and apparatus for providing privacy for telephone conversations over communications networks. In order to clearly illustrate the teachings of the current invention, the following terminologies and networking concepts will first be described:

Cellular communications system; and

A cellular phone.

Cellular communications system refers to a wireless communications system that divides a geographical region into sections called cells for the purpose of re-using wireless transmission frequencies. Cellular systems allocate a set number of frequencies for each cell and enable two cells to use the same frequency for different conversations as long as the cells are not adjacent.

A cellular phone refers to an endpoint device used to access telephony services via a cellular communications system, such as a cellular access network. A cellular phone may contain an antenna, a display, a keyboard, a keypad, a speaker, a memory, a microprocessor, a microphone, etc.

The antenna is used by various transmitter and receiver components for transmitting or receiving radio signals. The keyboard, keypad, and display can be used as input/output devices, e.g., for entering telephone numbers, viewing the number for an incoming call, etc. The speaker is used for listening to voice signals created at the other end of the conversation by converting electrical signals to sound waves that may be heard. The memory is used for storing data.

The microprocessor can be implemented as one or more computer chips designed for general and/or specific purposes. For example, chips may be designed to perform Digital-Signal-Processing (DSP) functions, to process command and control signals, to interact with other components, e.g., input/output (I/O) devices, such as keyboards and displays, to perform web functions, to perform analog-to-digital and digital-to-analog conversion, to perform encoding/decoding functions, and so on.

In one embodiment, the microphone is used to receive voice signals from a user and to effect the conversion of the voice signals to electrical signals. For example, a cell phone user may speak into the phone's microphone to present a speech signal or a speech wave. The microphone detects the speech signal and forwards the analog signal to an analog-to-digital (A-to-D) converter. The (A-to-D) converter converts the received analog signal to a digital signal. The digital signals are then encoded and transmitted to the network service provider for delivery to the endpoint device at the other end of the conversation. The microphone's signal gain level is generally set to a nominal level to enable the (A-to-D) converter to receive a speech signal of sufficient quality for encoding and transmission. However, when a speaker significantly lowers his or her voice in an attempt to maintain privacy, the CODEC may encounter difficulty encoding the low volume speech signal, and the listener on the other end of the call may have trouble hearing and/or understanding the speech.

In one embodiment, the current invention provides privacy for telephone conversations by providing a manually activated temporary signal gain boost feature for a microphone on an endpoint device, e.g., a cellular phone, a wireless headset, a telephone handset for a Time Division Multiplexed (TDM) service, a cordless phone, etc. The feature enables a phone user to temporarily apply a gain boost to the microphone in a phone or a headset (mouthpiece). The temporary gain boost will allow the user to speak in a lower volume for increased privacy, while simultaneously providing the CODEC in the phone with a signal level of sufficient quality for encoding. In other words, when activated, the microphone in the user end-device will have increased sensitivity to receive a lower volume voice signal from a speaker. More specifically, the received audio signal receives additional amplification to provide the CODEC with an input signal that is in a normal expected range.

Figure 2:
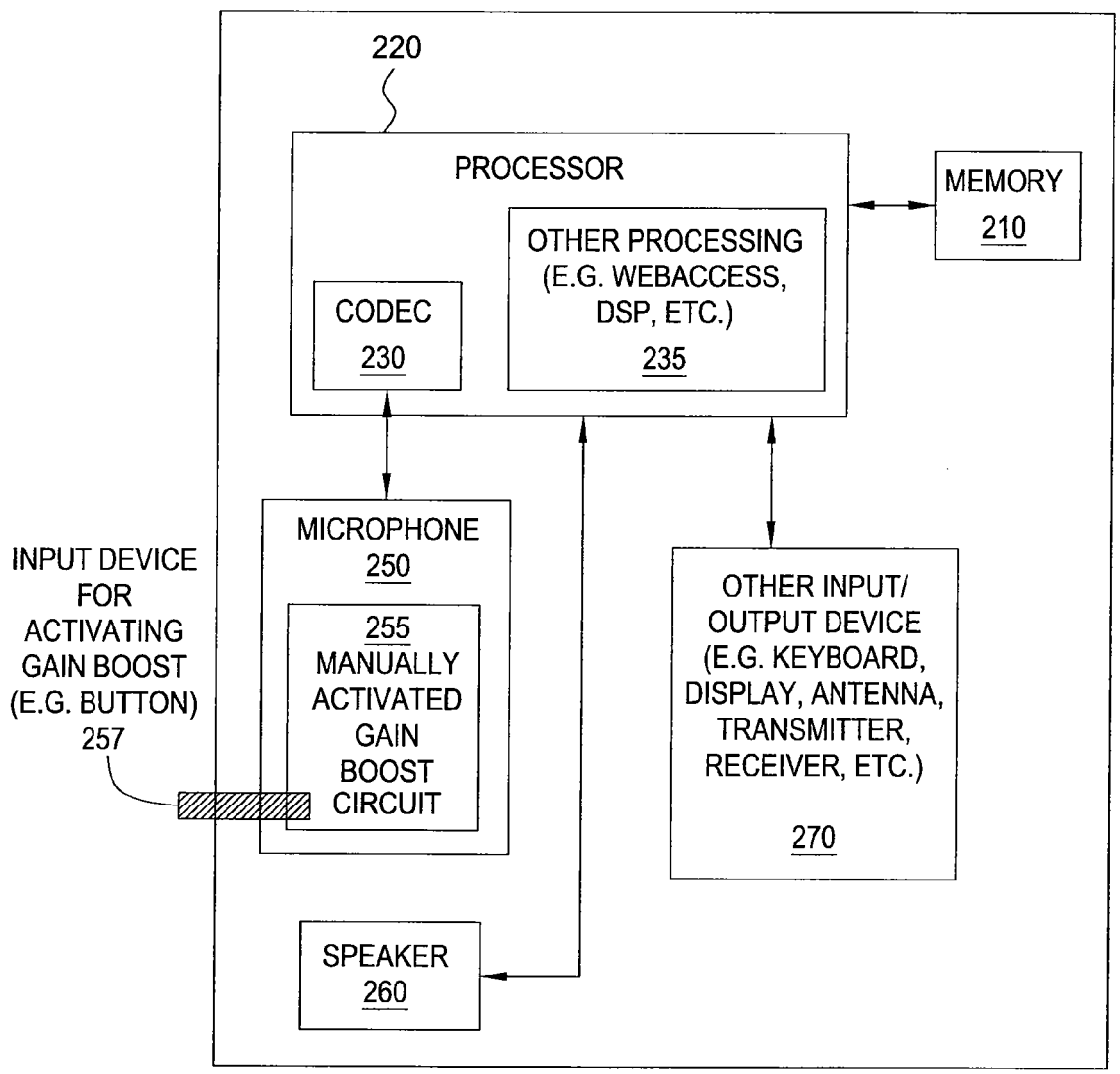
FIG. 2 illustrates an exemplary endpoint device.

FIG. 2 illustrates an exemplary endpoint device (broadly a telephony endpoint device) 200 of the current invention. The endpoint device 200 comprises a memory 210, e.g., a random access memory (RAM) and/or a read only memory (ROM), a processor 220, a microphone 250, a speaker 260, and various other input/output devices 270 (e.g., storage devices, including but not limited to, a tape drive, a floppy drive, a hard disk drive or a compact disk drive, an antenna, a receiver, a transmitter, a display, an output port, and a user input device (such as a keyboard, a keypad, a mouse, alarm interfaces, power relays and the like)). In one embodiment, the processor 220 can be implemented as one or more computer chips designed to perform Digital-Signal-Processing (DSP) functions, to process command and control signals, to interact with other components, e.g., input/output (I/O) devices, such as keyboards and displays, to perform web functions, to perform analog-to-digital and digital-to-analog conversion, to perform encoding/decoding functions, and so on. Alternatively, it should be noted that the various functions can also be implemented as software applications that can be loaded into the memory and executed by the processor.

In one embodiment, the microphone 250 comprises a manually activated gain boost circuit or module 255 and an input device 257 (e.g., a spring loaded button or switch) for activating the gain boost circuit 255. For example, the microphone 250 receives voice signals from a user, processes the received voice signals to create electrical signals, and then forwards the electrical signals to the CODEC 230. If the user wishes to speak in a lower volume for privacy reasons, then the user simply activates the gain boost circuit 255 by depressing and holding the input device 257. In doing so, the gain boost circuit 255 temporarily provides an additional gain to the microphone element, thereby amplifying the received audio signal. Subsequently, if the user no longer wants to speak at a lower volume, then the user simply releases the input device 257 and returns to a normal speaking volume to continue the conversation.

In one embodiment, the gain boost circuit 255 may also include circuitry for controlling the amplitude of the microphone's output signal in order to prevent the output signal from overloading the CODEC. For example, the microphone's output signal (with the temporary high-gain) may be controlled to limit the nominal and peak amplitudes of the output signal.

In one embodiment, the gain boost circuit 255 may include ambient noise canceling technology to prevent the simultaneous amplification of ambient background noise along with the lower level speech signal from the user. For example, ambient noise canceling technology may be implemented by including a second microphone with a pickup pattern and directionality that captures predominantly the ambient noise signal. The phase of the signal from the second microphone is then 180-degree reversed and the signal is mixed in with the speech signal. Thus, the 180-degree phase reversed signal from the second microphone provides phase cancellation of the ambient noise for the primary speech signal. The resulting signal (i.e. without the ambient noise) may then be presented to the CODEC for encoding the audio signal. The encoded audio signal can then be transmitted via a transmitter to a communication network.

It should be noted that the present invention is not limited to any particular implementation of a gain boost circuit and/or a noise cancellation circuit. Namely, any existing gain boost circuits and/or noise cancellation circuits can be deployed in the present invention.

In one embodiment, the input device for activating the gain boost circuit 255 can be implemented as a dedicated button or switch on a mobile phone, a handset, or a headset. In one embodiment, the button is implemented as a momentary "push-to-activate—release-to-deactivate" button. In another embodiment, the button is implemented as a constant activation feature "push-to-activate—push-to-deactivate" button. In other words, depressing and releasing the button to apply the gain boost to the audio signal and then depressing and releasing the switch a second time to stop applying the gain boost to the audio signal. It should be noted that the present invention is not limited by the manner in which the input device 257 is deployed.

The above methods for activating the gain boost circuit enable a speaker (e.g., a cell phone user) to activate the gain boost circuit by pushing a button on the mobile phone or a headset. The user may then speak in a low volume voice into the phone in order to protect the privacy of the conversation. For example, if a person is on a crowded bus and needs to communicate private information, e.g., a bank PIN, a security code, a password, and the like, to the other party on the call, he/she may simply depress the button while he/she whispers the private information. When the private information is communicated to the other party, then the user may release the button to de-activate the gain boost circuit. The microphone then returns to its normal gain level.

Figure 3:
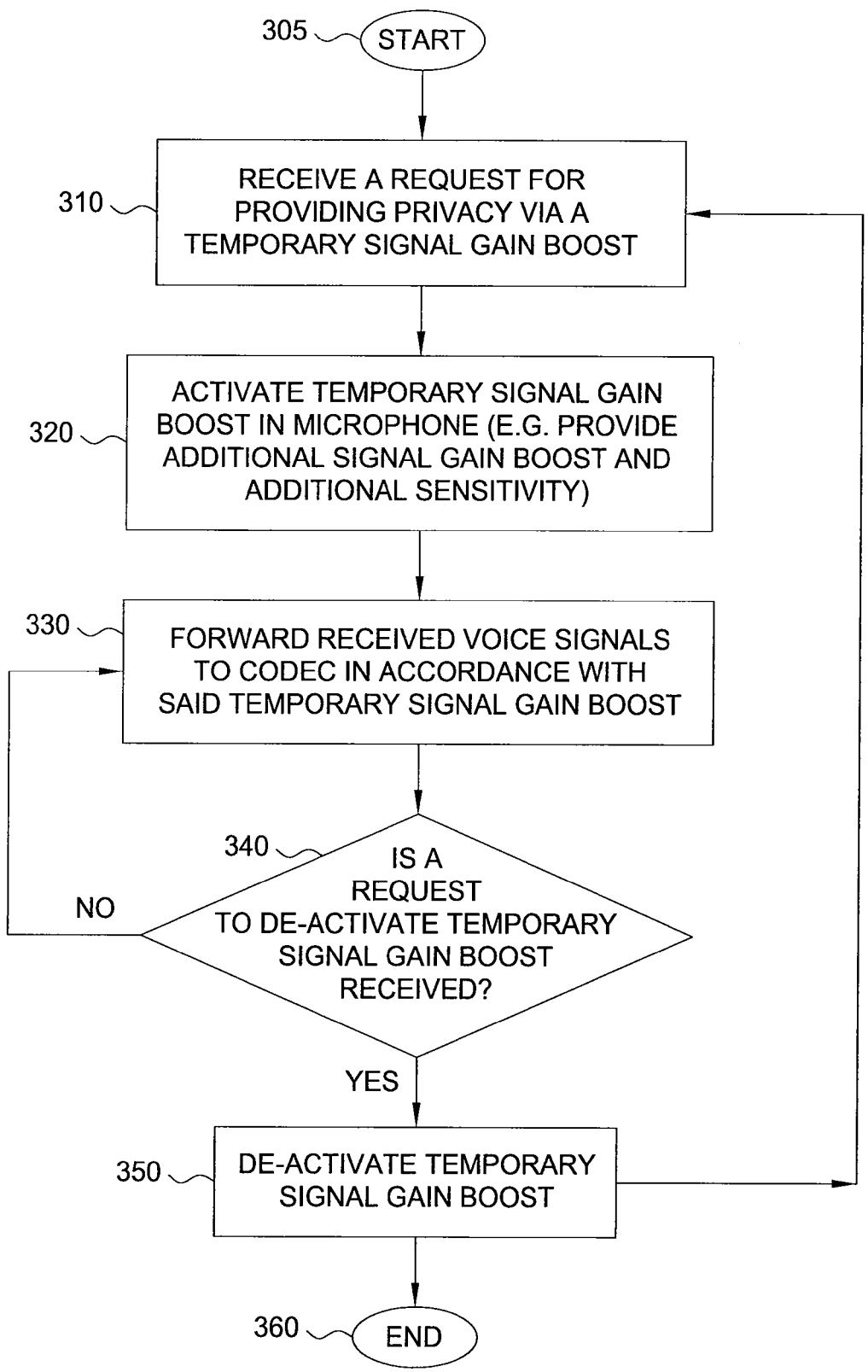
FIG. 3 illustrates a flowchart of a method for providing privacy for telephone conversations.

FIG. 3 illustrates a flowchart of a method 300 for providing privacy for telephone conversations. For example, method 300 can be implemented within a mobile phone or a head set. Method 300 starts in step 305 and proceeds to step 310.

In step 310, method 300 receives a request or an input for providing privacy via a temporary signal gain boost. For example, a user activates a gain boost feature in an endpoint device (e.g., a cell phone, a handset/headset, etc.) by depressing an activation button.

In step 320, method 300 activates the temporary signal gain boost. For example, additional signal gain boost and additional sensitivity are provided to the microphone in the endpoint device.

In step 330, method 300 forwards the amplified voice signals to the CODEC. For example, the microphone in the user end-device processes the received voice signal by applying an amplification to the received signal prior to forwarding the amplified signal to the CODEC.

In step 340, method 300 determines whether or not a request to deactivate the temporary signal gain boost is received. If a user request to deactivate the temporary signal gain boost is received, then the method proceeds to step 350. Otherwise, the method returns to step 330 to continue forwarding the received voice signal with a temporary signal gain boost.

In step 350, method 300 deactivates the temporary signal gain boost to enable the microphone to resume normal gain and sensitivity levels. The method then proceeds to step 360 to end processing the current request or returns to step 310 to continue receiving other requests.

It should be noted that although not specifically specified, one or more steps of method 300 may include a storing, displaying and/or outputting step as required for a particular application. In other words, any data, records, fields, and/or intermediate results discussed in the method can be stored, displayed and/or outputted to another device as required for a particular application. Furthermore, steps or blocks in FIG. 3 that recite a determining operation or involve a decision, do not necessarily require that both branches of the determining operation be practiced. In other words, one of the branches of the determining operation can be deemed as an optional step.

Figure 4:
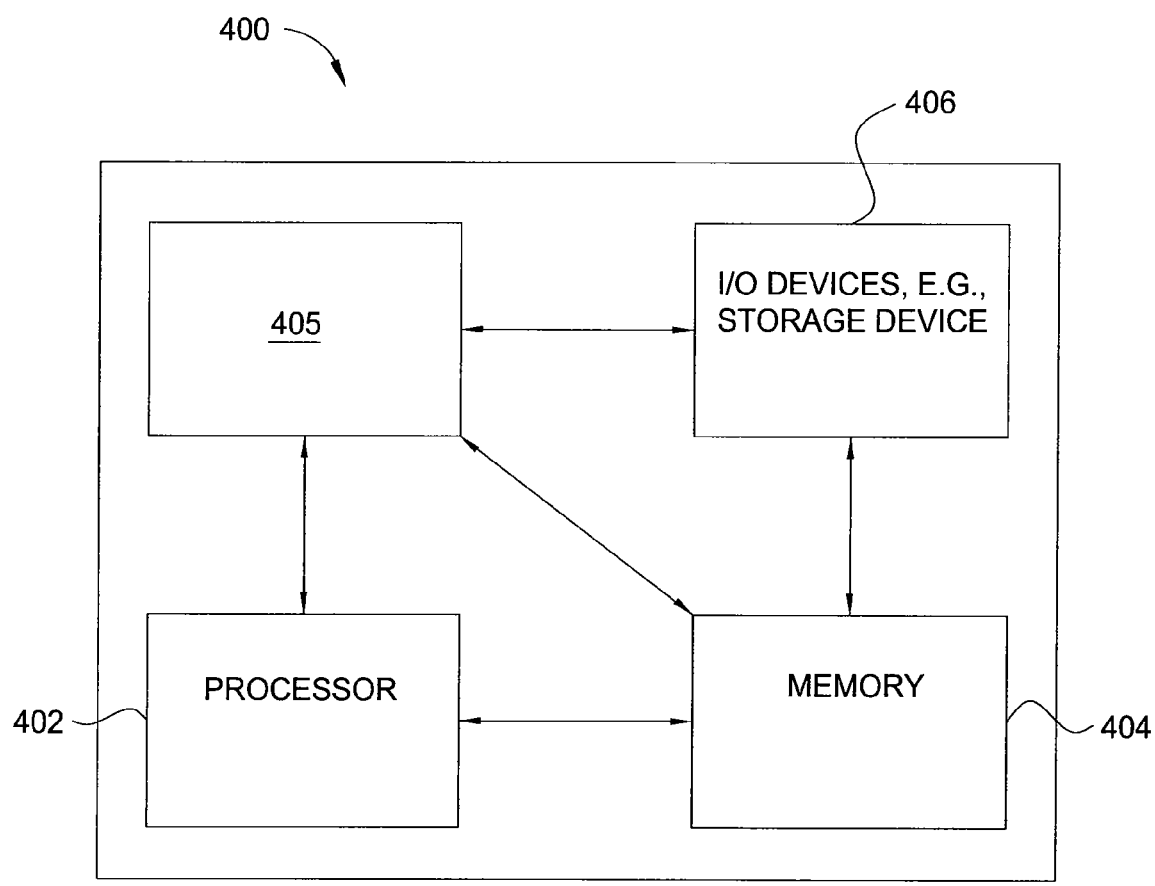
FIG. 4 illustrates a high-level block diagram of a general-purpose computer suitable for use in performing the functions described herein.

FIG. 4 depicts a high-level block diagram of a general-purpose computer suitable for use in performing the functions described herein. As depicted in FIG. 4, the system 400 comprises a processor element 402 (e.g., a CPU), a memory 404, e.g., random access memory (RAM) and/or read only memory (ROM), a module 405 for providing privacy for telephone conversations, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, alarm interfaces, power relays and the like)).

It should be noted that the present invention can be implemented in software and/or in a combination of software and hardware, e.g., using application specific integrated circuits (ASIC), a general-purpose computer or any other hardware equivalents. In one embodiment, the present module or process 405 for providing privacy for telephone conversations can be loaded into memory 404 and executed by processor 402 to implement the functions as discussed above. As such, the present method 405 for providing privacy for telephone conversations (including associated data structures) of the present invention can be stored on a computer readable medium or carrier, e.g., RAM memory, magnetic or optical drive or diskette and the like.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A telephony endpoint device, comprising:
a microphone for receiving an audio signal;
a gain boost circuit, coupled to the microphone, for applying a gain boost to the audio signal, wherein the gain boost circuit further applies a noise cancellation to the audio signal;
a manually activated switch, coupled to the gain boost circuit, wherein operating the manually activated switch controls whether the gain boost and the noise cancellation are to be applied to the audio signal to produce a resulting audio signal, wherein the operating the manually activated switch comprises depressing the manually activated switch to apply the gain boost and the noise cancellation to the audio signal; and
a transmitter for transmitting the resulting audio signal to a communication network.

2. The telephony endpoint device of claim 1, wherein the audio signal is a speech signal.

3. The telephony endpoint device of claim 1, wherein operating the manually activated switch further comprises:
releasing the manually activated switch to stop applying the gain boost and the noise cancellation to the audio signal.

4. The telephony endpoint device of claim 1, wherein operating the manually activated switch further comprises:
depressing the manually activated switch a second time to stop applying the gain boost and the noise cancellation to the audio signal.

5. The telephony endpoint device of claim 1, further comprising:
a coder/decoder for processing the resulting audio signal into an encoded audio signal.

6. The telephony endpoint device of claim 5, further comprising:
wherein the transmitter is for transmitting the encoded audio signal to the communication network.

7. The telephony endpoint device of claim 1, wherein the telephony endpoint device is a mobile phone.

8. A method for processing an audio signal, comprising:
receiving an audio signal via a microphone of a telephony endpoint device;
receiving a user input via a manually activated switch to apply a gain boost and a noise cancelation to the audio signal, wherein the user input is received when the manually activated switch is depressed;
applying the gain boost to the audio signal and applying the noise cancellation to the audio signal to produce a resulting audio signal, wherein the applying is performed in response to the user input being received; and
transmitting the resulting audio signal to a communication network via a transmitter.

9. The method of claim 8, wherein the audio signal is a speech signal.

10. The method of claim 8,
wherein releasing the manually activated switch stops the gain boost and the noise cancellation from being applied to the audio signal.

11. The method of claim 8,
wherein depressing the manually activated switch a second time stops the gain boost and the noise cancellation from being applied to the audio signal.

12. The method of claim 8, further comprising:
processing the resulting audio signal into an encoded audio signal via a coder/decoder.

13. The method of claim 12, further comprising:
transmitting the encoded audio signal to the communication network via the transmitter.

14. A non-transitory computer-readable medium storing a plurality of instructions which, when executed by a processor, cause the processor to perform operations for processing an audio signal, the operations comprising:
receiving an audio signal via a microphone of a telephony endpoint device;
receiving a user input via a manually activated switch to apply a gain boost and a noise cancelation to the audio signal, wherein the user input is received when the manually activated switch is depressed;
applying the gain boost to the audio signal and applying Ran the noise cancellation to the audio signal to produce a resulting audio signal, wherein the applying is performed in response to the user input being received; and
transmitting the resulting audio signal to a communication network via a transmitter.

15. The non-transitory computer-readable medium of claim 14, wherein the audio signal is a speech signal.

16. The non-transitory computer-readable medium of claim 14,
wherein releasing the manually activated switch stops the gain boost and the noise cancellation from being applied to the audio signal.

17. The non-transitory computer-readable medium of claim 14,
wherein depressing the manually activated switch a second time stops the gain boost and the noise cancellation from being applied to the audio signal.

* * * * *